US010090204B1

(12) United States Patent
Zang et al.

(10) Patent No.: US 10,090,204 B1
(45) Date of Patent: Oct. 2, 2018

(54) VERTICAL FINFET STRUCTURE AND METHODS OF FORMING SAME

(71) Applicant: GLOBALFOUNDRIES INC., Grand Cayman (KY)

(72) Inventors: Hui Zang, Guilderland, NY (US); Jae Gon Lee, Waterford, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/609,201

(22) Filed: May 31, 2017

(51) Int. Cl.
| H01L 29/78 | (2006.01) |
| H01L 21/8234 | (2006.01) |
| H01L 27/088 | (2006.01) |
| H01L 29/08 | (2006.01) |
| H01L 29/423 | (2006.01) |
| H01L 29/06 | (2006.01) |
| H01L 23/535 | (2006.01) |

(52) U.S. Cl.
CPC ........... *H01L 21/823462* (2013.01); *H01L 21/823418* (2013.01); *H01L 21/823437* (2013.01); *H01L 21/823475* (2013.01); *H01L 21/823481* (2013.01); *H01L 21/823487* (2013.01); *H01L 23/535* (2013.01); *H01L 27/088* (2013.01); *H01L 29/0649* (2013.01); *H01L 29/0847* (2013.01); *H01L 29/42368* (2013.01); *H01L 29/42376* (2013.01); *H01L 29/7827* (2013.01)

(58) Field of Classification Search
CPC ................. H01L 29/66666; H01L 29/7827
See application file for complete search history.

(56) References Cited

U.S. PATENT DOCUMENTS

| 9,761,712 B1 * | 9/2017 | Anderson ........... H01L 29/7827 |
| 2015/0380548 A1 * | 12/2015 | Wang ................. H01L 29/7827 257/329 |

* cited by examiner

*Primary Examiner* — Thomas L Dickey
(74) *Attorney, Agent, or Firm* — Yuanmin Cai; Hoffman Warnick LLC

(57) ABSTRACT

The disclosure is directed to an integrated circuit structure and methods of forming the same. The integrated circuit structure may include: a set of fins within an ILD layer on a substrate; a first gate dielectric over the substrate and extending along opposing sidewalls of each fin in the set of fins, a metal stack adjacent to the first gate dielectric and on the opposing sidewalls of each fin, the metal stack having a first portion over the substrate and a second portion contacting the first gate dielectric and extending along the opposing sidewalls of each fin, wherein at least the first portion of the metal stack and a portion of the first gate dielectric above the substrate is replaced by another dielectric material; a set of epitaxial regions within the ILD layer; and a conductor within the ILD layer and extending over each epitaxial region.

8 Claims, 14 Drawing Sheets

VERTICAL FINFET STRUCTURE AND METHODS OF FORMING SAME

BACKGROUND

Technical Field

The present disclosure relates to a vertical fin-shaped field effect transistor having L-shaped metal stacks and methods of forming the same.

Related Art

In integrated circuit (IC) structures, a transistor is a critical component for implementing digital circuitry designs. Generally, a transistor includes three electrical terminals: a source, a drain, and a gate. By applying different voltages to the gate terminal, electric current from the source to the drain can be turned on and off. A common type of transistor is a metal oxide field effect transistor (MOSFET). One type of MOSFET structure is a "FINFET," which may be formed upon a semiconductor-on-insulator (SOI) layer and buried insulator layer. A FINFET can include a semiconductor structure etched into a "fin" shaped body, with one side of the fin acting as a source terminal and the other side of the fin acting as a drain terminal. A gate structure, typically composed of polysilicon and/or a metal, can be formed around one or more of the semiconductor fins. By applying a voltage to the gate structure, an electrically conductive channel can be created between the source and drain terminals of each fin in contact with the gate.

In some cases, a FINFET may be desirable in IC structures which do not include an SOI layer with a corresponding buried insulator layer. For example, processors for mobile applications can include forming transistor structures on a bulk substrate instead of an SOI-type structure. Planar devices can be formed conventionally within the bulk substrate without substantial modifications. A FINFET may also be adapted for use on a bulk substrate material instead of SOI. However. FINFETs on bulk substrates can have a leakage path in the sub-fin region, i.e., the region of the fin below the gate. This leads to significant drain to source current. i.e., punch-through current, which has to be suppressed with a punch-through stop implant. A punch-though stop implant includes implanting dopants to prevent expansion of the drain depletion into the source terminal. However, such implanting leads to unwanted high doping concentrations in the fin which degrades carrier mobility and introduces within-fin non-uniformities.

SUMMARY

A first aspect of the disclosure is directed to a method of forming an integrated circuit structure. The method may include: forming a first gate dielectric over a substrate and on opposing sidewalls of each fin in a set of fins extending from the substrate, the first gate dielectric including a first portion over the substrate and a second portion extending along the opposing sidewalls of each fin such that the first gate dielectric is substantially L-shaped, wherein the first gate dielectric has a dielectric constant above approximately 4.0; forming a metal stack over the first gate dielectric, the metal stack having a first portion over the first portion of the first gate dielectric and a second portion contacting the second portion of the first gate dielectric and extending along the opposing sidewalls of each fin such that the metal stack is substantially L-shaped; removing a part of the first portion of the metal stack and a part of the first portion of the first gate dielectric that covers the substrate from between adjacent fins of the set of fins; conformally forming a first dielectric layer over each fin such that the first dielectric layer substantially lines the second portion of the metal stack on the opposing sidewalls of each fin, the first dielectric layer separating the first portion of the metal stack on opposing sidewalls of each fin from the first portion of the metal stack on opposing sidewalls of an adjacent fin, wherein the first dielectric layer has a dielectric constant below approximately 4.0; forming an interlevel dielectric (ILD) layer over the first dielectric layer and the set of fins; forming an epitaxial region over each fin within the ILD layer; and forming a conductor over each epitaxial region and within the ILD layer.

A second aspect of the disclosure is directed to an integrated circuit structure. The integrated circuit structure may include: a set of fins within an ILD layer on a substrate; a first gate dielectric over the substrate and extending along opposing sidewalls of each fin in the set of fins, wherein the first gate dielectric has a dielectric constant above approximately 4.0; a metal stack adjacent to the first gate dielectric and on the opposing sidewalls of each fin, the metal stack having a first portion over the substrate and a second portion contacting the first gate dielectric and extending along the opposing sidewalls of each fin, wherein at least the first portion of the metal stack and a portion of the first gate dielectric above the substrate is replaced by another dielectric material having a dielectric constant smaller than that of the first gate dielectric; a set of epitaxial regions within the ILD layer, each epitaxial region within the set of epitaxial regions being over the top surface of a respective fin in the set of fins; and a conductor within the ILD layer and extending over each epitaxial region.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein:

FIGS. 1, 3, and 6-14 show a cross-sectional view of the preliminary integrated circuit structure and FIGS. 2, 4, and 5 show a top-down view of the preliminary integrated circuit structure.

FIG. 15 shows a cross-sectional view of the resulting integrated circuit structure and FIG. 16 shows a top-down view of the resulting integrated circuit structure.

FIG. 18 shows a cross-sectional view of the preliminary integrated circuit structure and FIG. 19 shows a top-down view of the preliminary integrated circuit structure.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

The present disclosure relates to a vertical field effect transistor (VFET) having L-shaped metal stacks and methods of forming the same. More specifically, the VFET may include a set of fins having a gate dielectric having a high dielectric constant and a metal stack on opposing sidewalls of each fin. The gate dielectric and the metal stack may each be substantially L-shaped on opposing sidewalls of each fin. The gate dielectric and the metal stack on opposing sidewalls of each fin may be separated from the gate dielectric and the metal stack on opposing sidewalls of an adjacent fin by a layer having a low dielectric constant (low-k layer). That is, in the field between adjacent fins, a low-k layer may separate the substantially L-shaped gate dielectric and the substantially L-shaped metal stack. As a result, parasitic capacitance of the VFET is reduced.

Figure 1:
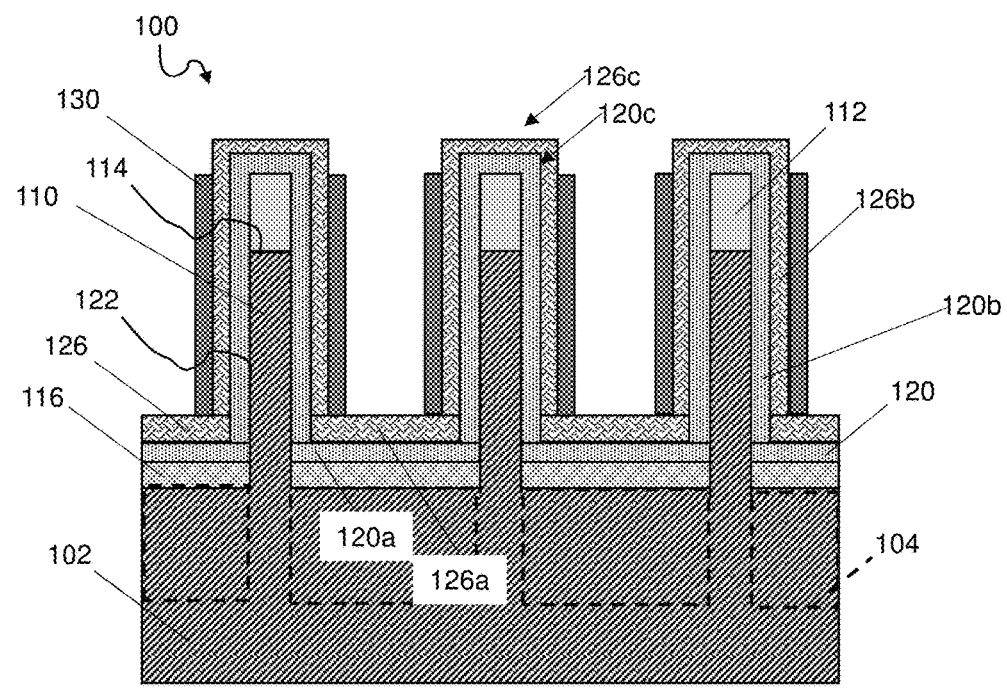
FIGS. 1-14 show a preliminary integrated circuit structure undergoing aspects of a method according to embodiments of the disclosure where

Referring now to FIG. 1, a cross-sectional view of a preliminary integrated circuit (IC) structure 100 is shown. IC structure 100 may include a VFET, however, it is to be understood that aspects of the disclosure herein may be equally applicable to other types of IC structures, e.g., fin-shaped FETs. IC structure 100 may include a substrate 102 having one or more fins 110 formed therefrom. Substrate 102 may include but is not limited to: silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entirety of substrate 102 may be strained. While substrate 102 is shown as including a single layer of semiconductor material, it is emphasized that the teachings of the disclosure are equally applicable to semiconductor-on-insulator (SOI) substrates. As known in the art, SOI substrates may include a semiconductor layer on an insulator layer on another semiconductor layer (not shown). The semiconductor layers of an SOI substrate may include any of the semiconductor substrate materials discussed herein. The insulator layer of the SOI substrate may include any now known or later developed SOI substrate insulator such as but not limited to silicon oxide.

Fins 110 may be formed from substrate 102, e.g., by patterning a mask 112 and etching, such that fins 110 overlie a remaining portion of substrate 102. Where substrate 102 includes an SOI substrate, fins 110 may be formed from the upper semiconductor layer over the insulator layer. As shown, a portion of mask 112 may remain over a top surface 114 of fins 110. Substrate 102 and/or portions thereof may be p- or n-type doped such that substrate 102 and/or portions thereof may function as the bottom source/drain terminal of the VFET. For example, a portion of substrate 102 may be doped between adjacent fins 110 to create a bottom source/drain 104 (shown in phantom).

As used herein "etching" generally refers to the removal of material from a substrate or structures formed on the substrate by wet or dry chemical means. In some instances, it may be desirable to selectively remove material from certain areas of the substrate. In such an instance, a mask may be used to prevent the removal of material from certain areas of the substrate. There are generally two categories of etching, (i) wet etch and (ii) dry etch. Wet etching may be used to selectively dissolve a given material and leave another material relatively intact. Wet etching is typically performed with a solvent, such as an acid. Dry etching may be performed using a plasma which may produce energetic free radicals, or species neutrally charged, that react or impinge at the surface of the wafer. Neutral particles may attack the wafer from all angles, and thus, this process is isotropic. Ion milling, or sputter etching, bombards the wafer with energetic ions of noble gases from a single direction, and thus, this process is highly anisotropic. A reactive-ion etch (RIE) operates under conditions intermediate between sputter etching and plasma etching and may be used to produce deep, narrow features, such as trenches. While three fins 110 are shown, it is to be understood that any number of fins may be employed without departing from aspects of the disclosure.

IC structure 100 may also include isolation layer or bottom spacer 116 over substrate 102 to separate device regions (not individually referenced). As shown, bottom spacer 116 may be disposed between and separate adjacent fins 110. Bottom spacer 116 may be formed by depositing an insulator and etching, e.g., silicon oxide, silicon nitride, silicon oxynitride. As used herein, the term "depositing" may include any now known or later developed technique appropriate for deposition, including but not limited to, for example: chemical vapor deposition (CVD), low-pressure CVD (LPCVD), plasma-enhanced CVD (PECVD), semi-atmosphere CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

Still referring to FIG. 1, a gate dielectric layer 120 may be formed, e.g., conformally deposited, over substrate 102 and on opposing sidewalls 122 of each fin 110 such that gate dielectric layer 120 extends from substrate 102 along sidewalls 122 of each fin 110. More specifically, gate dielectric layer 120 may be formed directly over bottom spacer 116. Gate dielectric layer 120 may include a first portion 120a that is disposed over and extends horizontally over substrate 102. Gate dielectric layer 120 may also include a second portion 120b that extends vertically along opposing sidewalls 122 of each fin 110. In addition, gate dielectric layer 120 may include a third portion 120c that is disposed over top surface 114 of each fin 110, or more specifically, over portion of mask 112 over top surface 114 of each fin 110. As shown, gate dielectric layer 120 may substantially surround each fin 110. Gate dielectric layer 120 may include, for example, any dielectric material having a dielectric constant above 4.0 (a high-k layer). Such dielectric materials may include, for example, hafnium oxide, hafnium silicate, nitride hafnium silicate, zirconium oxide, zirconium silicate, titanium oxide, lanthanum oxide, yttrium oxide, aluminum oxide, or combinations thereof.

A metal stack 126 may be formed, e.g., conformally deposited, over gate dielectric layer 120. Metal stack 126 may include a first portion 126a that is disposed over and extends horizontally over first portion 120a of gate dielectric layer 120. Metal stack 126 may also include a second portion 126b that contacts second portion 120b of gate dielectric layer 120 and extends vertically along opposing sidewalls 122 of each fin 110. In addition, metal stack 126 may include a third portion 126c that is disposed over top surface 114 of each fin 110, or more specifically, over third portion 120c of gate dielectric layer 120 over portion of mask 112 over top surface 114 of each fin 110. While shown as a single layer, metal stack 126 may include more than one layer or material. For example, metal stack 126 may include a work function metal layer, a gate conductor layer, and optional barrier layers. As known in the art, work function metal layers may act as a doping source, and a different work function setting metal can then be employed depending on whether a n-type field-effect-transistor (NFET) or a p-type field-effect-transistor (PFET) device is desired. Thus, the same gate conductor can be used in each of the devices, yet a different (if so desired) work function setting metal can be used in one or more devices to obtain a different doping polarity. By way of example only, suitable work function setting metals for use in PFET devices include, but are not limited to aluminum, dysprosium, gadolinium, and ytterbium. Suitable work function setting metals for use in NFET devices include, but are not limited to lanthanum, titanium, and tantalum. Optional barrier layers may include, for example, titanium nitride, tantalum nitride, hafnium nitride, hafnium silicon nitride, titanium silicon nitride, tantalum silicon nitride, tungsten nitrogen carbide, and hafnium aluminum nitride. Gate conductor layers may include, for example, at least one of: titanium, titanium nitride, tungsten, tungsten nitride, copper, copper nitride, tantalum, or tantalum nitride.

Sidewall spacers 130 may be formed on IC structure 100 such that sidewalls spacers 130 substantially surround metal stack 126 that surrounds each fin 110. As shown in the cross-sectional view of IC structure 100 in FIG. 1, sidewall spacers 130 may include a pair of sidewall spacers 130 on the opposing sidewalls 122 of each fin 100 such that sidewall spacers 130 substantially line second portion 126b of the metal stack 126 along the opposing sidewalls 122 of each fin 110. Sidewall spacers 130 may be formed by depositing and etching a dielectric material such that fins 110 are substantially surrounded by sidewall spacers 130. The dielectric material defining sidewall spacers 130 may include, for example, an oxide, such as silicon oxide, or a nitride, such as silicon nitride.

Figure 2:
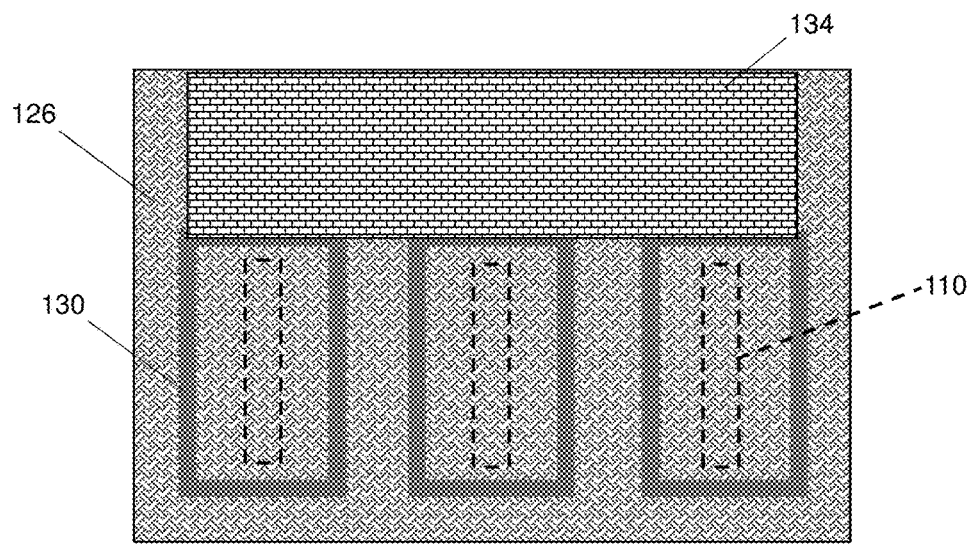

FIG. 2 shows a top-down view of IC structure 100 according to aspects of the disclosure where fins 110 are shown in phantom since they are disposed beneath metal stack 126 in this view. Sidewall spacers 130 are shown surrounding each fin 110. As shown in FIG. 2, a photoresist 134 may be formed over a portion of IC structure 100 and patterned and etched such that a portion of metal stack 126 at ends of fins 110 remains covered by photoresist 134. More specifically, the method may include forming photoresist 134 over a portion 126d (FIG. 5) of metal stack 126 that is disposed at a location that is adjacent to an end of each fin 110 such that photoresist 134 extends along the set of fins 110 perpendicular to the set of fins 110 at the end of each fin 110. Remaining portions of metal stack 126 that are disposed over fins 110, e.g., portion 126c, within sidewall spacers 130 and within the field outside of spacers 130, e.g., a part of portion 126a, may be exposed, i.e., not covered by photoresist 134.

Figure 3:
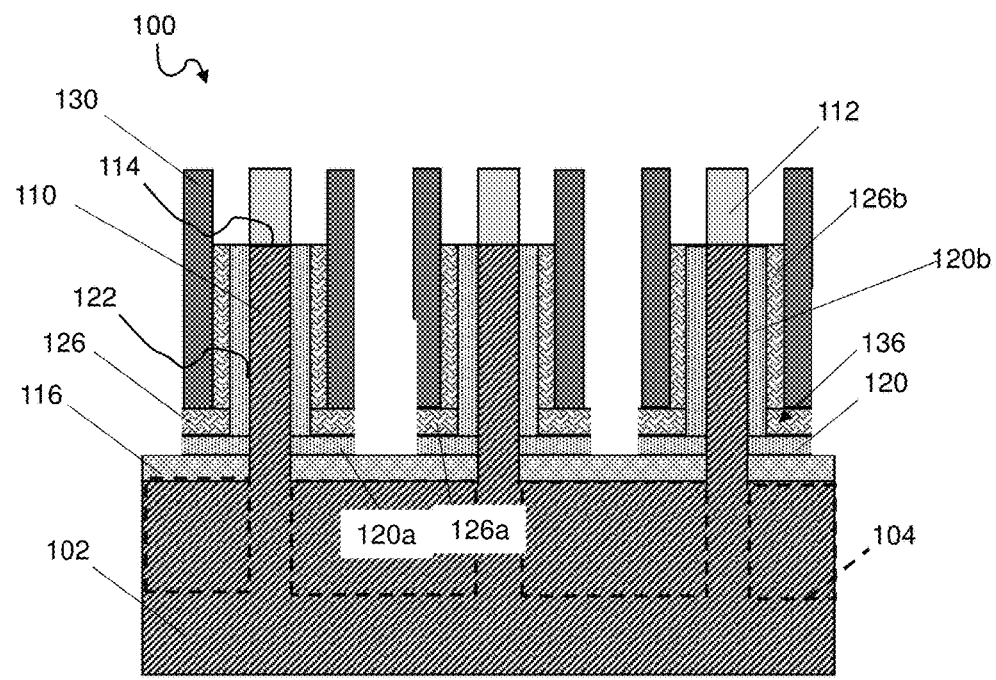
Figure 4:
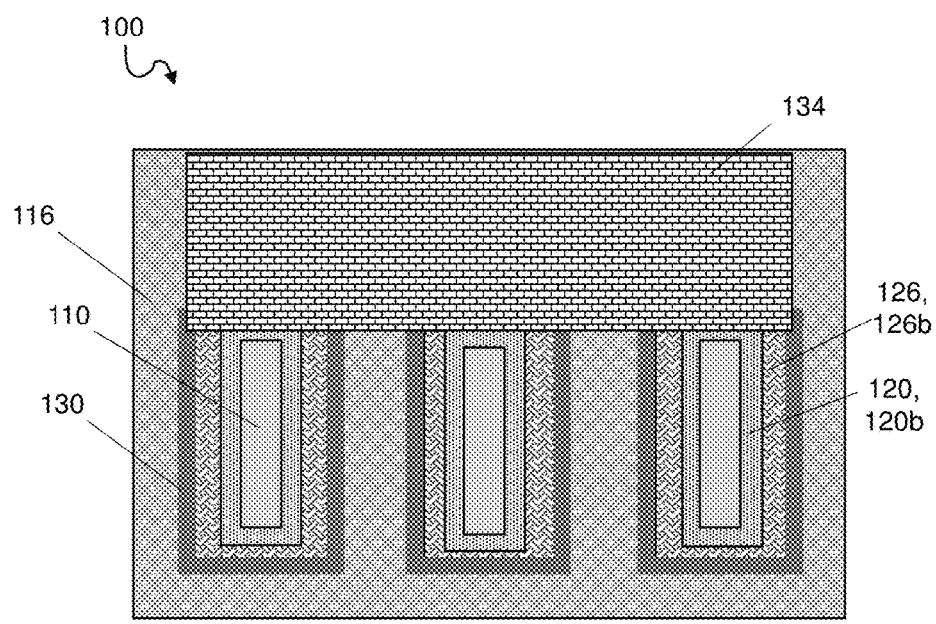

As shown in FIGS. 3-4, portions of metal stack 126 and gate dielectric layer 120 that are not protected by photoresist 134 and/or sidewall spacers 130 may be removed, e.g., by etching. As a result, portions of bottom spacer 116 that are disposed between adjacent fins 110 and do not have photoresist 134 or sidewall spacers 130 thereover may be exposed. More specifically, the method may include using sidewall spacers 130 as a mask to remove a part of first portion 126a of metal stack 126 and a part of first portion 120a of gate dielectric layer 120 that is over substrate 102 from between adjacent fins 110 such that a remaining part of first portion 120a and second portion 120b of the gate dielectric layer 120 remains immediately adjacent to opposing sidewalls 122 of each fin 110. As will be described herein, these removed portions are replaced with a dielectric material having a dielectric constant less than gate dielectric layer 120 which results in a reduction in parasitic capacitance. Additionally, sidewall spacers 130 may be used as a mask such that a remaining part of first portion 126a and second portion 126b of metal stack 126 remains immediately adjacent to the remaining part of first portion 120a and second portion 120b of gate dielectric layer 120, respectively.

Additionally, a third portion 126c (FIG. 1) of metal stack 126 and a third portion 120c (FIG. 1) of gate dielectric layer 120 may also be removed from over top surface 114 of each fin 110 to expose mask 112 that is disposed over top surface 114 of each fin 110. As a result, second portion 120b of gate dielectric layer 120 and second portion 126b of metal stack 126 extending along opposing sidewalls 122 of fins 110 may also be exposed within sidewall spacers 130. As a result, metal stack 126 is substantially L-shaped. In addition, remaining portions of gate dielectric layer 120, portions 120a, 120b, define a substantially L-shaped gate dielectric 136. While sidewall spacers 130 are used as a mask during this removal, photoresist 134 may remain on IC structure 100 covering portion 126d (FIG. 5) of metal stack 126 thereby preventing portion 126d from being removed as shown in FIG. 4.

Figure 5:
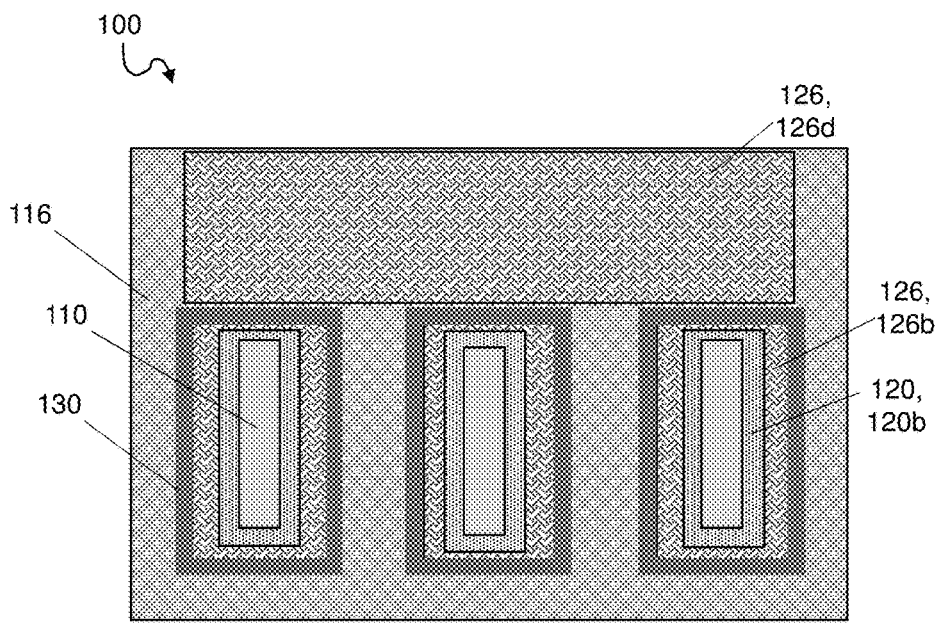

Turning to FIG. 5, photoresist 134 (FIG. 4) may be removed, e.g., by etching or stripping, to expose portion 126d of metal stack 126 at ends of fins 110. That is, photoresist 134 may be removed such that portion 126d of metal stack 126 remains extending along the set of fins 110, perpendicular to the set of fins 110 at the end of each fin 110. As will be described herein, portion 126d provides electrical connection between metal stack 126 on opposing sidewalls 122 of fins 110 in the resulting IC structure and a gate contact.

Figure 6:
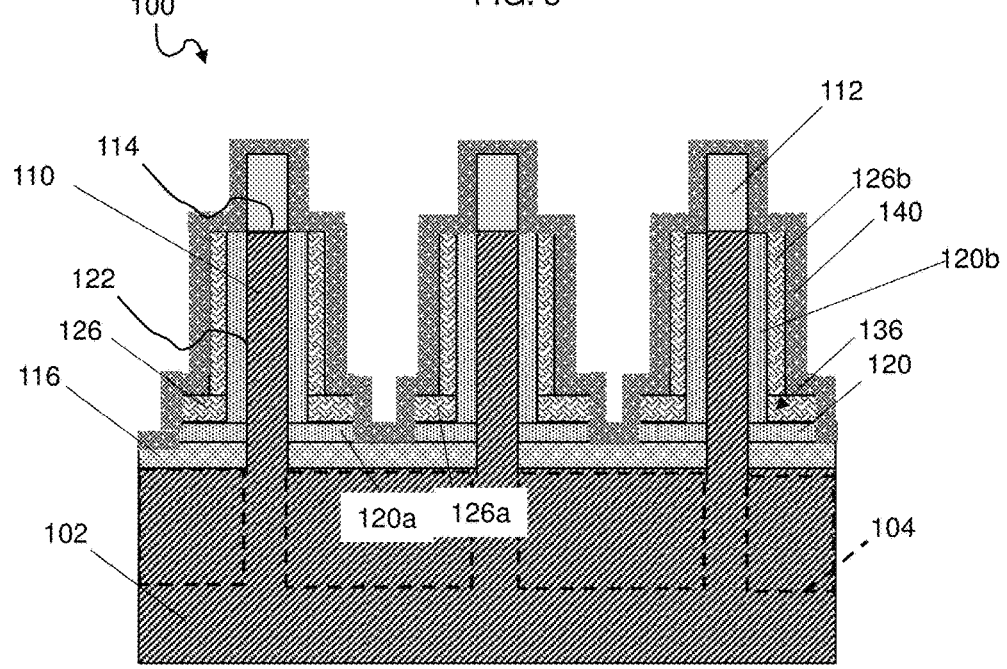

Turning now to FIG. 6, sidewall spacers 130 (FIG. 4) may be removed, e.g., by etching, from IC structure 100 to expose second portion 126b of metal stack 126 on opposing sidewalls 122 of each fin 110. Additionally, another dielectric layer 140 may be conformally formed, i.e., conformally deposited, over each fin 110 such that dielectric layer 140 substantially lines second portion 126b of metal stack 126 on opposing sidewalls 122 of each fin 110. Dielectric layer 140 may include any dielectric material having a dielectric constant below approximately 4.0, such as for example, silicon nitride, silicon oxide, fluorinated SiO2 (FSG), hydrogenated silicon oxycarbide (SiCOH), porous SiCOH, borophospho-silicate glass (BPSG), silsesquioxanes, carbon doped oxides (i.e., organosilicates) that include atoms of silicon, carbon, oxygen, and/or hydrogen, thermosetting polyarylene ethers, SiLK (a polyarylene ether available from Dow Chemical Corporation), a spin-on silicon-carbon containing polymer material available from JSR Corporation, other low dielectric constant (<4.0) material, or layers thereof.

Figure 7:
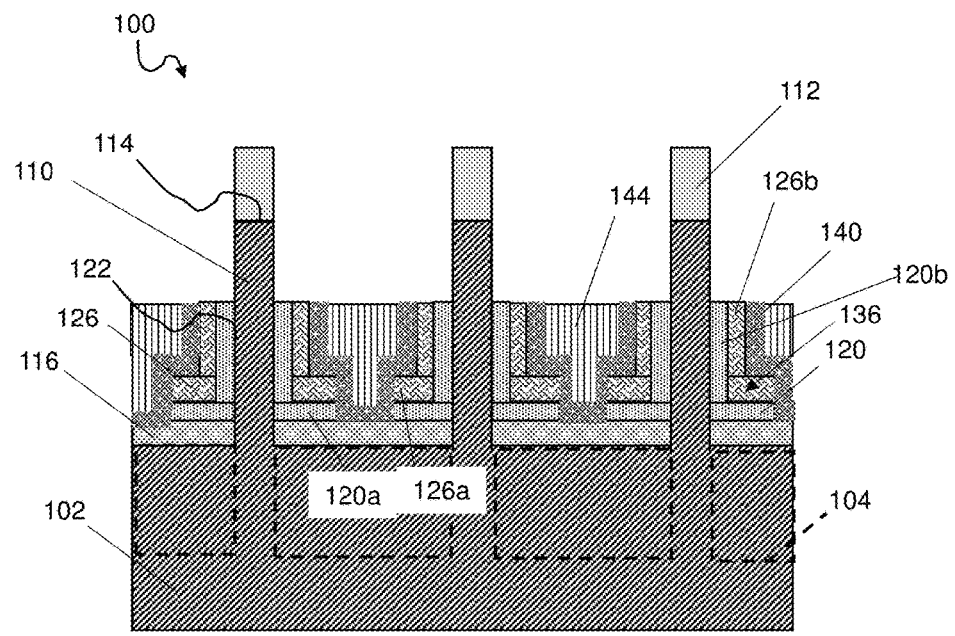
Figure 8:
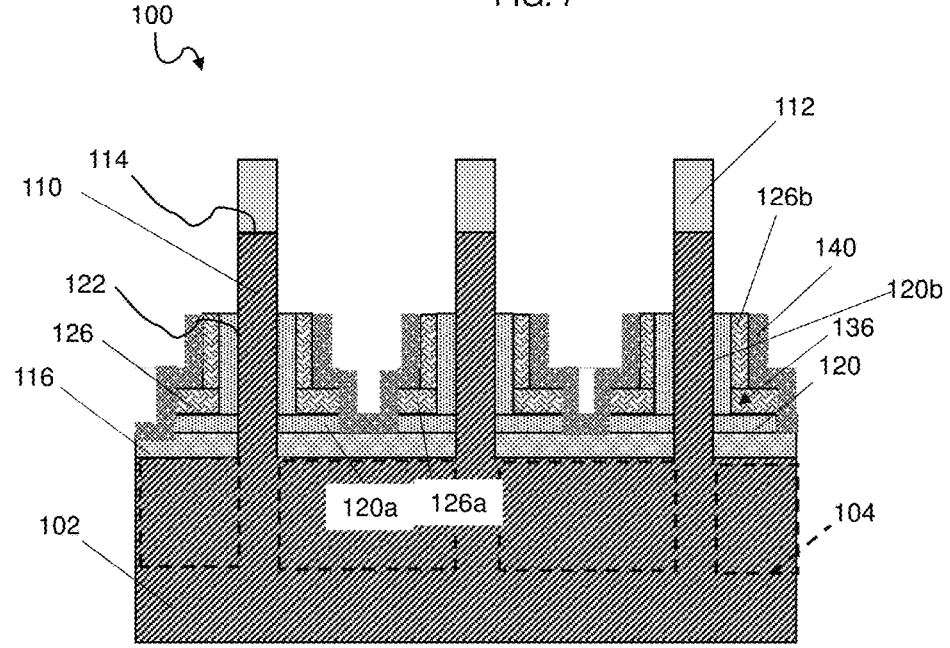

As shown in FIGS. 7-8, the method may continue with recessing dielectric layer 140, second portion 126b of metal stack 126, and second portion 120b of gate dielectric layer 120 on opposing sidewalls 122 of each fin 110. The recessing may include first forming an organic dielectric layer (ODL) 144 (FIG. 7) over substrate 102 to a height that is less than a height of dielectric layer 140 that is substantially lining second portion 126b of the metal stack 126 on opposing sidewalls 122 of each fin 110. Dielectric layer 140, second portion 126b of metal stack 126, and second portion 120b of gate dielectric layer 120 may be recessed, e.g., by etching, to the height of ODL 144 such that top surface 114 of each fin 110 (having masking layer 112 thereover) is exposed. Additionally, an upper portion of opposing sidewalls 122 of each fin 110 may be exposed. After recessing is complete, ODL 144 (FIG. 7) may be stripped as shown in FIG. 8.

Figure 9:
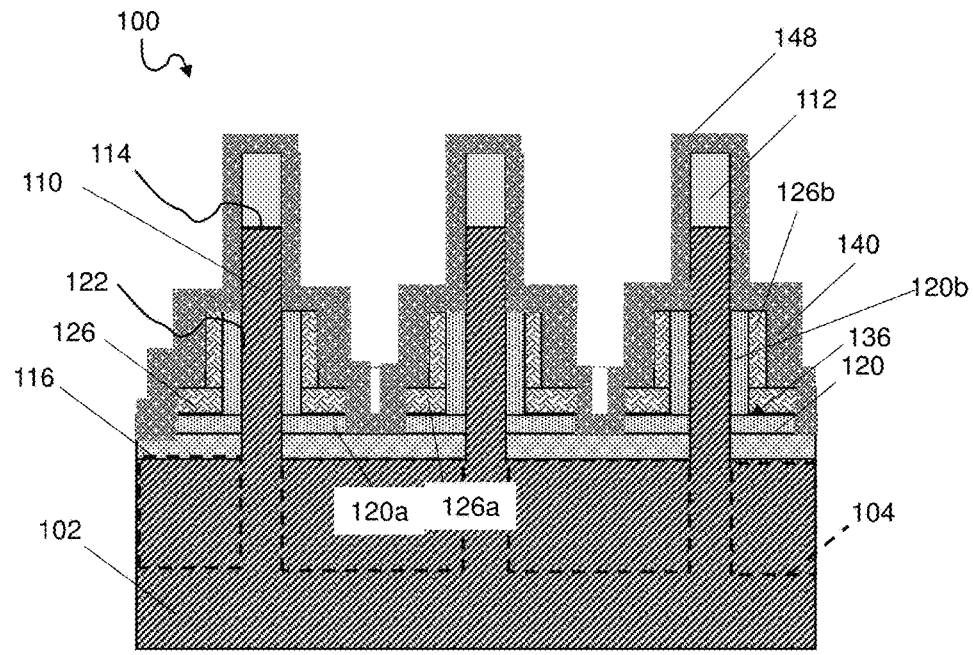

Turning now to FIG. 9, another dielectric layer 148 may be conformally formed, i.e., conformally deposited, over each fin 110 such that dielectric layer 148 substantially lines the exposed upper portion of opposing sidewalls 122 of each fin 110. Dielectric layer 148 may include any of the materials listed herein relative to dielectric layer 140 and is therefore shown in the same shading as dielectric layer 140. Dielectric layers 140, 148, together, may separate substantially L-shaped gate dielectric 136 and substantially L-shaped metal stack 126 on opposing sidewalls 122 of each fin 110.

Figure 10:
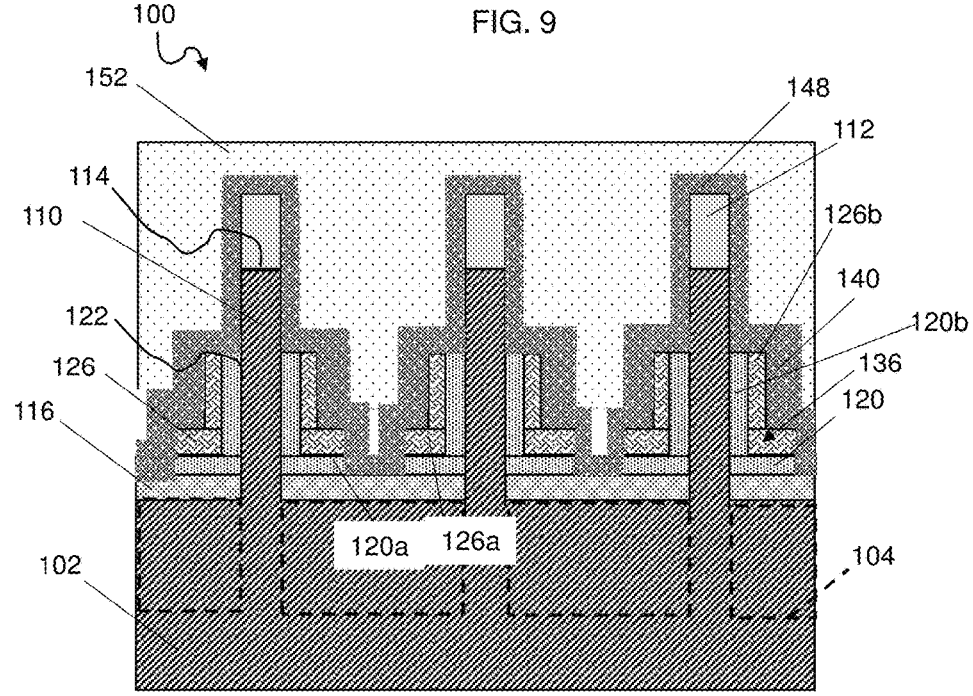

After dielectric layer 148 is formed, an interlevel dielectric (ILD) layer 152 may be formed over dielectric layer 148 and the set of fins 110 as shown in FIG. 10. ILD layer 152 may include at least one of: silicon nitride, silicon oxide, fluorinated $SiO_2$ (FSG), hydrogenated silicon oxycarbide (SiCOH), porous SiCOH, boro-phospho-silicate glass (BPSG), silsesquioxanes, carbon doped oxides (i.e., organosilicates) that include atoms of silicon, carbon, oxygen, and/or hydrogen, thermosetting polyarylene ethers, SiLK (a polyarylene ether available from Dow Chemical Corporation), a spin-on silicon-carbon containing polymer material available from JSR Corporation, other low dielectric constant (<4.0) material, or layers thereof.

Figure 11:
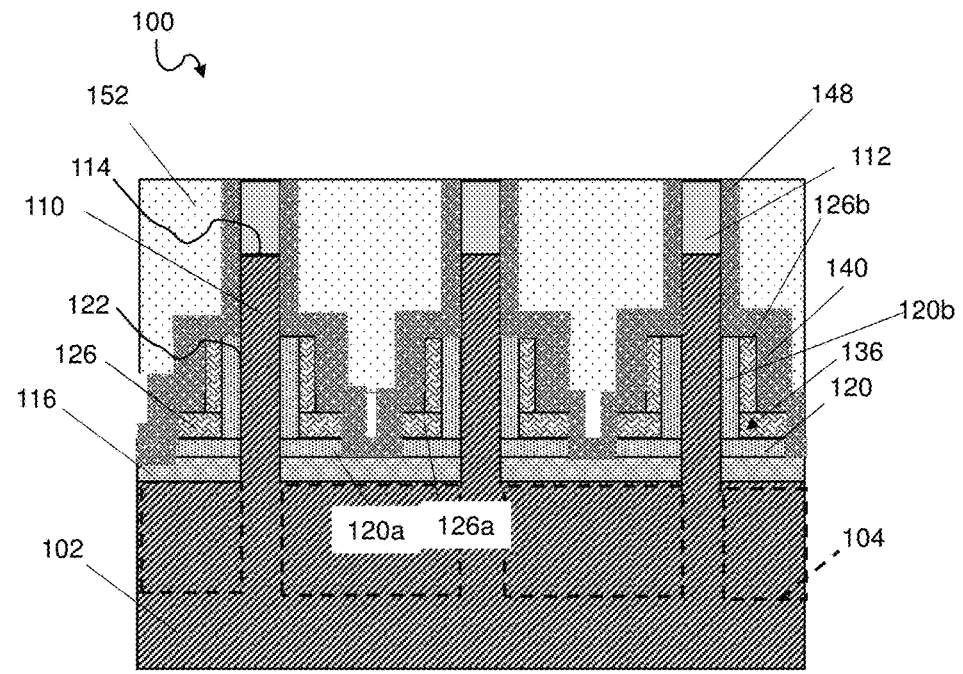
Figure 12:
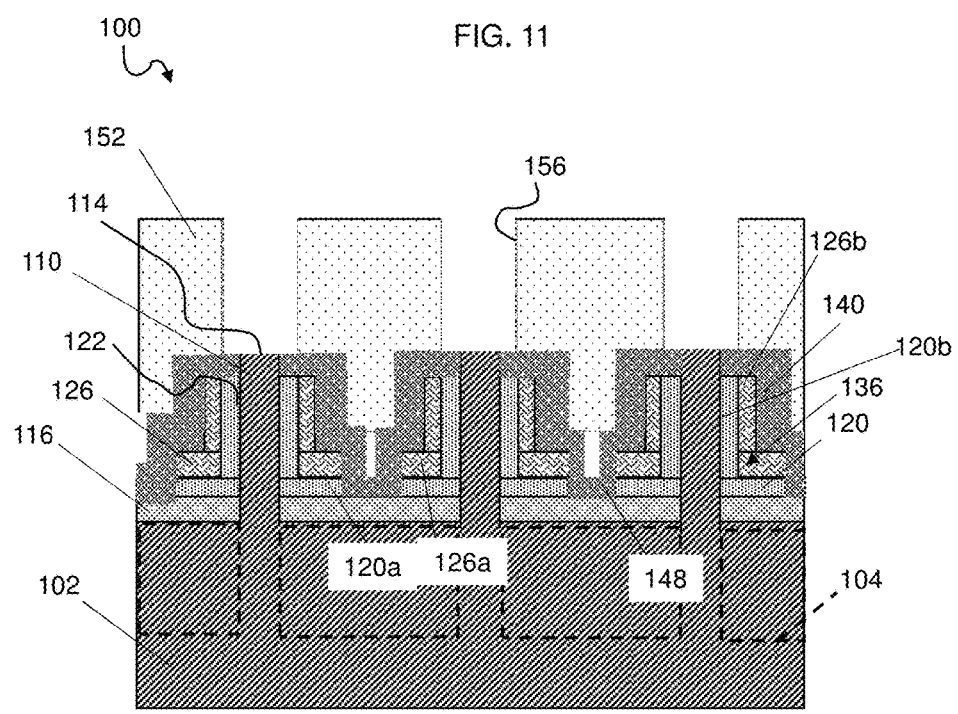
Figure 13:
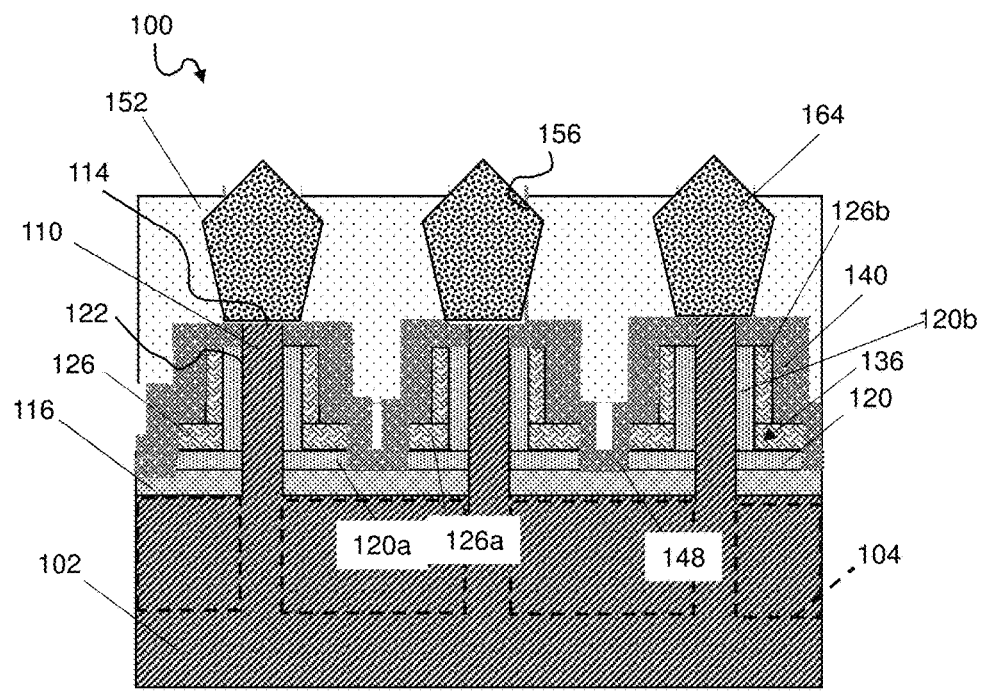

The method may continue with forming an epitaxial region 164 (FIG. 13) over each fin within ILD layer 152 as shown in FIGS. 11-13. Forming epitaxial region 164 may include, planarizing ILD layer 152 and dielectric layer 148 to a top surface of masking layer 112 over each fin 110 such that the top surface of masking layer 112 is exposed through ILD layer 152 as shown in FIG. 11. Planarization refers to various processes that make a surface more planar (that is, more flat and/or smooth). Chemical-mechanical-polishing (CMP) is one currently conventional planarization process which planarizes surfaces with a combination of chemical reactions and mechanical forces. Other currently conventional planarization techniques may include: (i) oxidation; (ii) chemical etching; (iii) taper control by ion implant damage; (iv) deposition of films of low-melting point glass; (v) resputtering of deposited films to smooth them out; (vi) photosensitive polyimide (PSPI) films; (vii) new resins; (viii) low-viscosity liquid epoxies; (ix) spin-on glass (SOG) materials; and/or (x) sacrificial etch-back.

Subsequently, an etching may be performed to remove masking layer 112 over each fin 110 and dielectric layer 148 within ILD that lines masking layer 112 as shown in FIG. 12. This removal process may also remove a portion of each fin 110. As a result, openings 156 may be formed within ILD layer 152 over and exposing each fin 110.

Turning now to FIG. 13, an epitaxial material may be grown over fins 110 within openings 156 to form epitaxial regions 164 over each fin 110 within the openings 156. The epitaxial material may include, for example, silicon, silicon germanium, or silicon carbon and may be doped with conventional n-type or p-type dopants. Epitaxial region 164 may function as a top source/drain region. The terms "epitaxial growth and/or deposition" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

Figure 14:
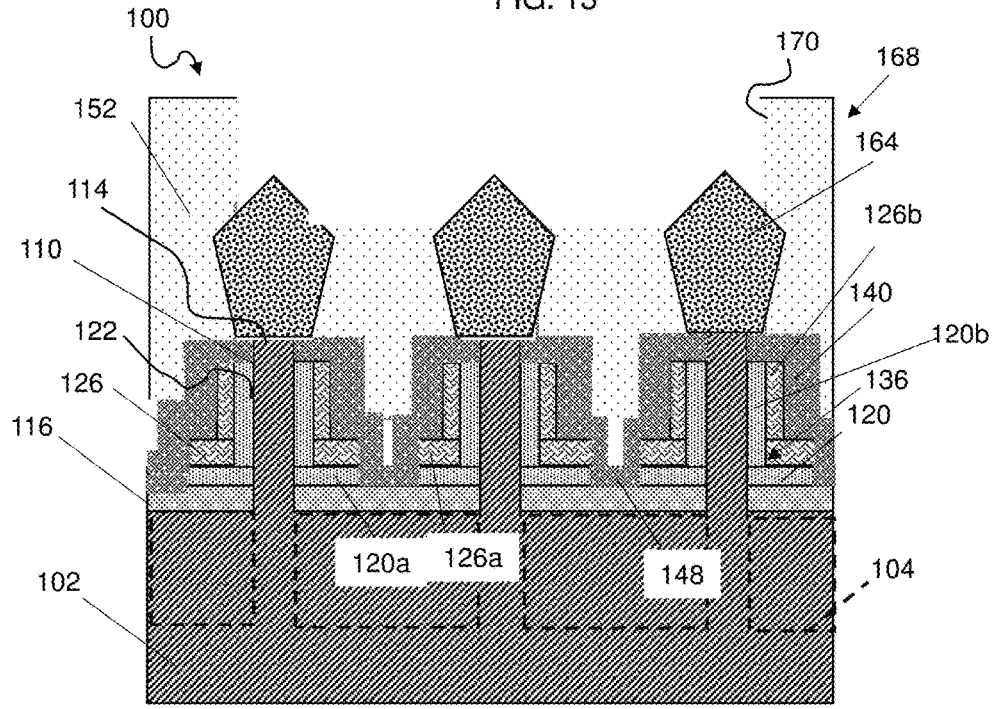
Figure 15:
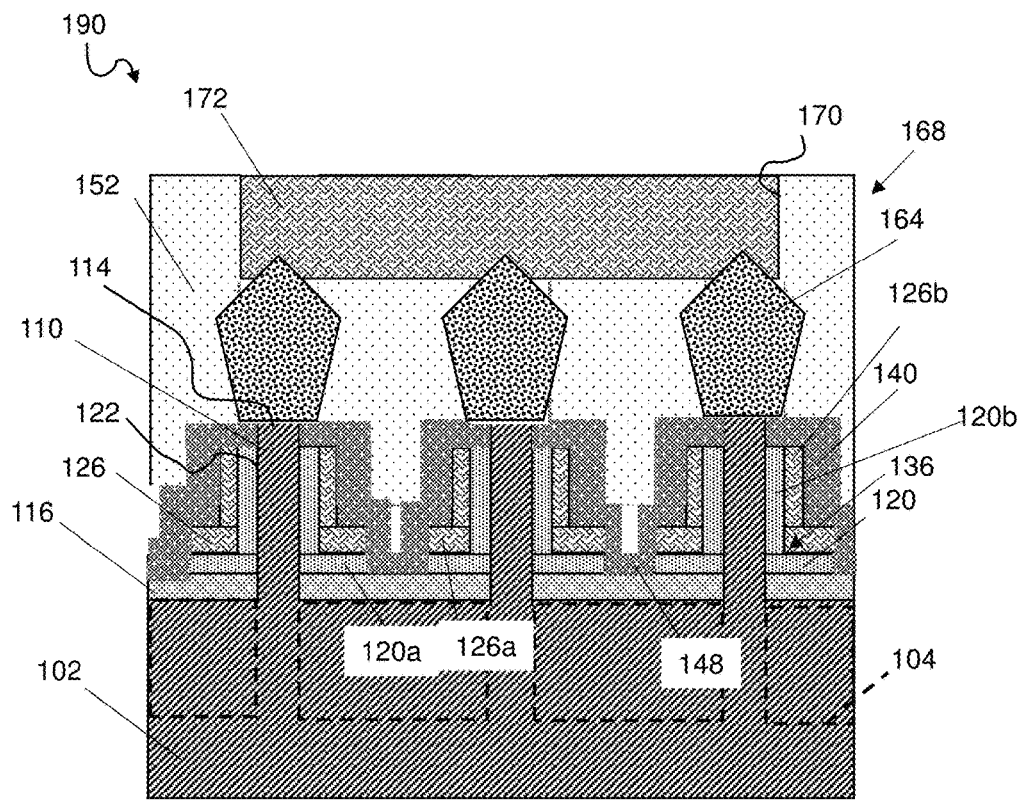
FIGS. 15 and 16 show a resulting integrated circuit structure after undergoing aspects of a method according to embodiments of the disclosure where

As shown in FIG. 14, the method may continue with forming conductor 172 (FIG. 15) over each epitaxial region 164 and within ILD layer 152 as shown in FIGS. 14-15. Forming conductor 172 may include, forming an additional section 168 of the ILD layer 152 over IC structure and over epitaxial regions 164. Further, an opening 170 may be formed, e.g., by patterning a mask (not shown) and etching, within additional section 168 of ILD layer 152 to expose epitaxial regions 164. Opening 170 may be filled, e.g., by deposition, with conductor 172 as shown in FIG. 15. Conductor 172 may be planarized to a top surface of additional section 168 of ILD layer 152. Conductor 172 may contact each epitaxial region 164 within ILD layer 152. Conductor 172 may include, for example, at least one of: titanium, titanium nitride, tungsten, tungsten nitride, copper, copper nitride, tantalum, or tantalum nitride. Conductor 172 may function as a contact for epitaxial region 164, i.e., upper source/drain.

The resulting IC structure 190 shown in FIG. 15 may include: set of fins 110 within ILD layer 152 on substrate 102 and gate dielectric 136 over substrate 102 and extending along opposing sidewalls 122 of each fin 110. Gate dielectric 136 may have a dielectric constant above approximately 4.0. IC structure 190 may also include metal stack 126 adjacent to gate dielectric 136 and on opposing sidewalls 122 of each fin 110. Metal stack 126 may include first portion 126a over substrate 102 and second portion 126b contacting gate dielectric 136 and extending along opposing sidewalls 122 of each fin 110. Gate dielectric 136 may include a portion, i.e., first portion 120a, that is disposed between first portion 126a of metal stack 126 and substrate 102. As shown in FIG. 15, gate dielectric 136 and metal stack 126 on opposing sidewalls 122 of each fin 110 may each be substantially L-shaped. IC structure 190 may also include dielectric layer 140, 148 adjacent to metal stack 126 and on opposing sidewalls 122 of each fin 110. Dielectric layer 140, 148 may have a dielectric constant less than approximately 4.0. IC structure 190 may also include epitaxial regions 164 within ILD layer 152. Each epitaxial region 164 may be disposed over top surface 114 of a respective fin 110. Additionally, IC structure 190 may include conductor 172 within ILD layer 152 and extending over each epitaxial region 164.

In contrast to conventional VFETs, IC structure 190 may include substantially L-shaped gate dielectrics 136 (having a high dielectric constant) and metal stacks 126 on opposing sidewalls 122 of fins 110 that are separated from gate dielectrics 136 and metal stacks 126 on opposing sidewalls 122 of adjacent fins 110 by dielectric layer 140, 148 (having a low dielectric constant). As a result, IC structure 190 may exhibit a reduced parasitic capacitance when compared to conventional VFETs.

Figure 16:
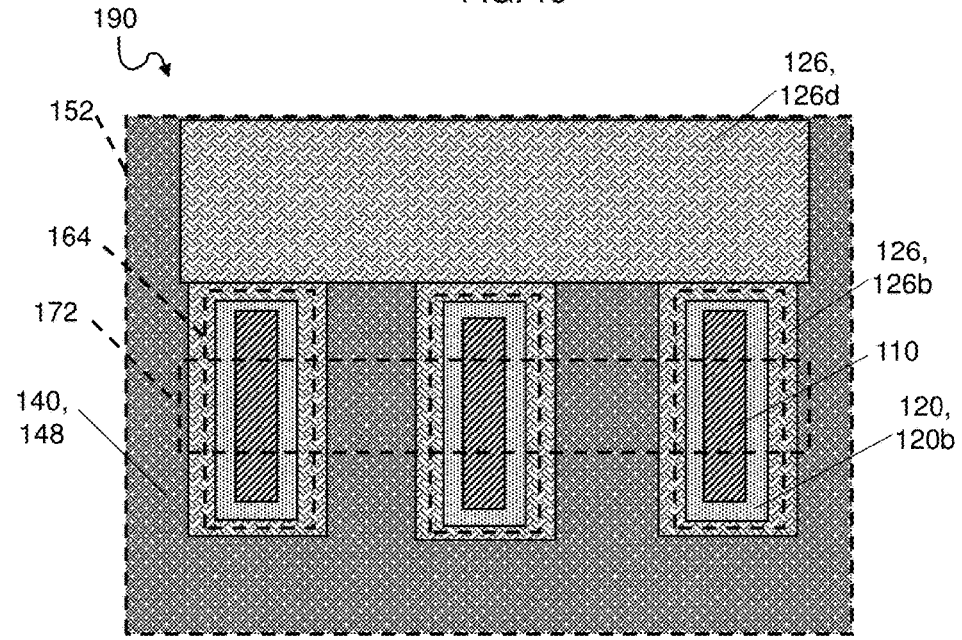

FIG. 16 shows a top-down view of resulting IC structure 190 of FIG. 15 wherein ILD 152, conductor 172, epitaxial region 164 and portions of dielectric layer 140, 148 over portion 126b of metal stack 126 and portion 120a of gate dielectric 136 are shown in phantom such that metal stack 126 on opposing sidewalls 122 of fins 110 can be seen thereunder. As shown, IC structure 190 may also include portion 126d of metal stack 126 over substrate 102 and within ILD layer 152. Portion 126d of metal stack 126 may be being disposed perpendicular to fins 110 and extend along at least one end of each fin 110. Portion 126d may provide electrical connection between portions 126a, 126b of metal stack 126 on opposing sidewalls 122 of fins 110 and a gate contact (not individually shown). In this way portion 126d may function as a gate contact landing.

Figure 17:
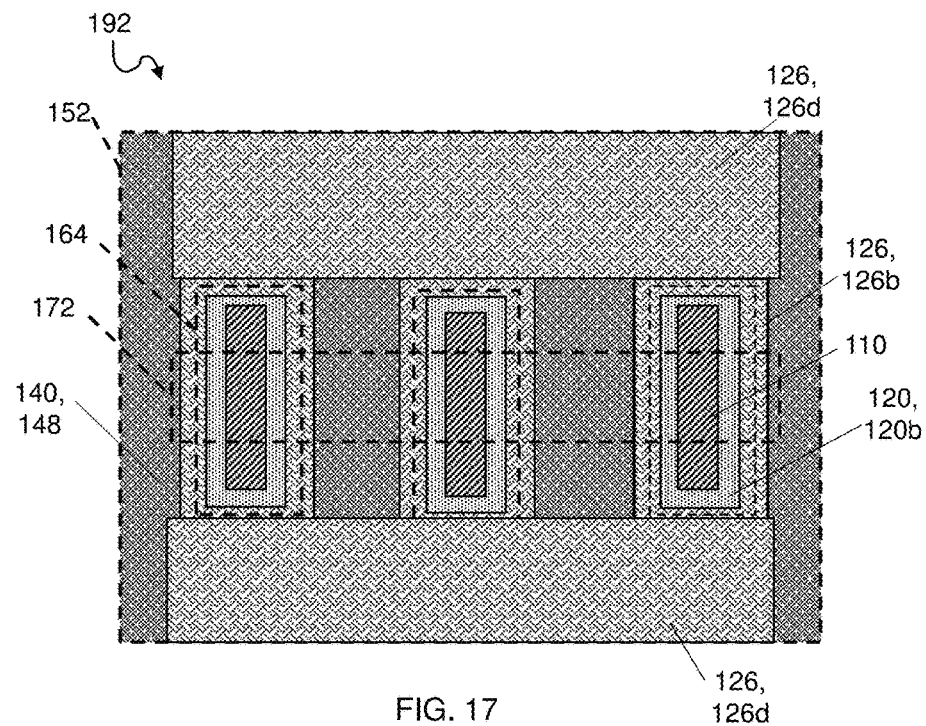
FIG. 17 shows a top-down view of a resulting integrated circuit structure according to another embodiment of the disclosure.

In an another embodiment, portion 126d of metal stack 126 may be disposed perpendicular to fins 110 and extend along both ends of each fin 110 as shown in FIG. 17. This embodiment may be accomplished by forming photoresist 134 (FIG. 4) on both ends of fins 110 such that when photoresist 134 is removed as discussed relative to FIG. 5, metal stack 126 remains on both ends of fins 110. Portion 126d may provide electrical connection between portions 126a, 126b of metal stack 126 on opposing sidewalls 122 of fins 110 and a gate contact (not individually shown). In this way, both portions 126d may function as a gate contact landing.

Figure 18:
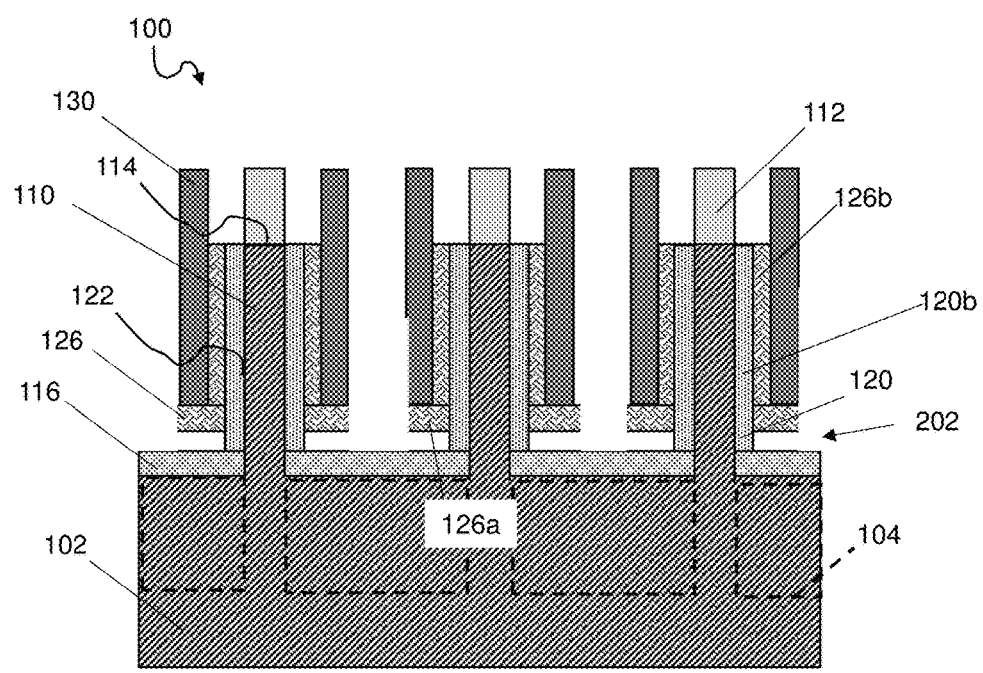
FIGS. 18-19 show a preliminary integrated circuit structure undergoing aspects of another method according to embodiments of the disclosure where
Figure 19:
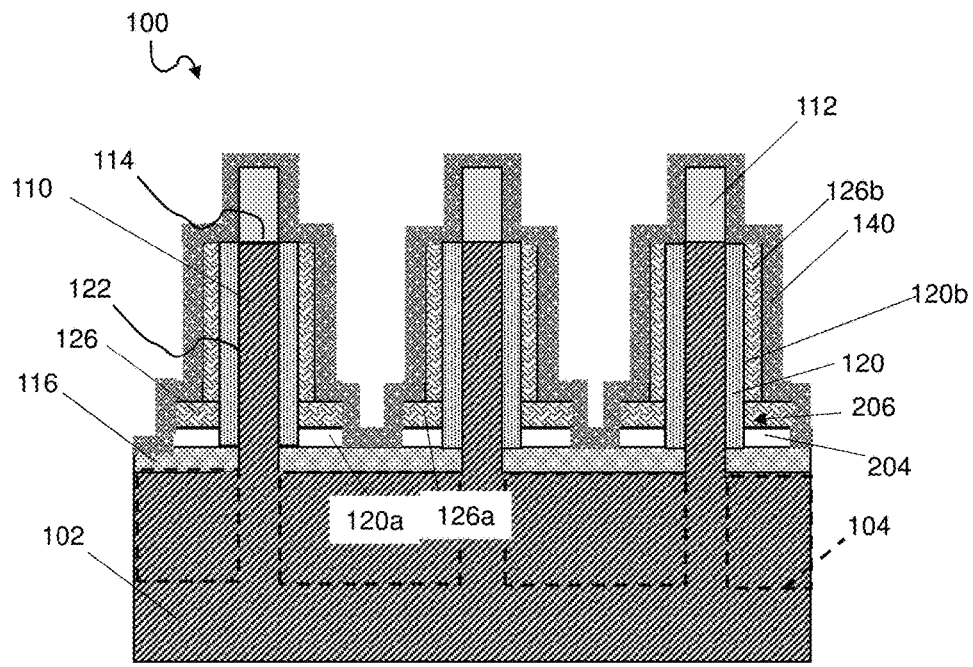
Figure 20:
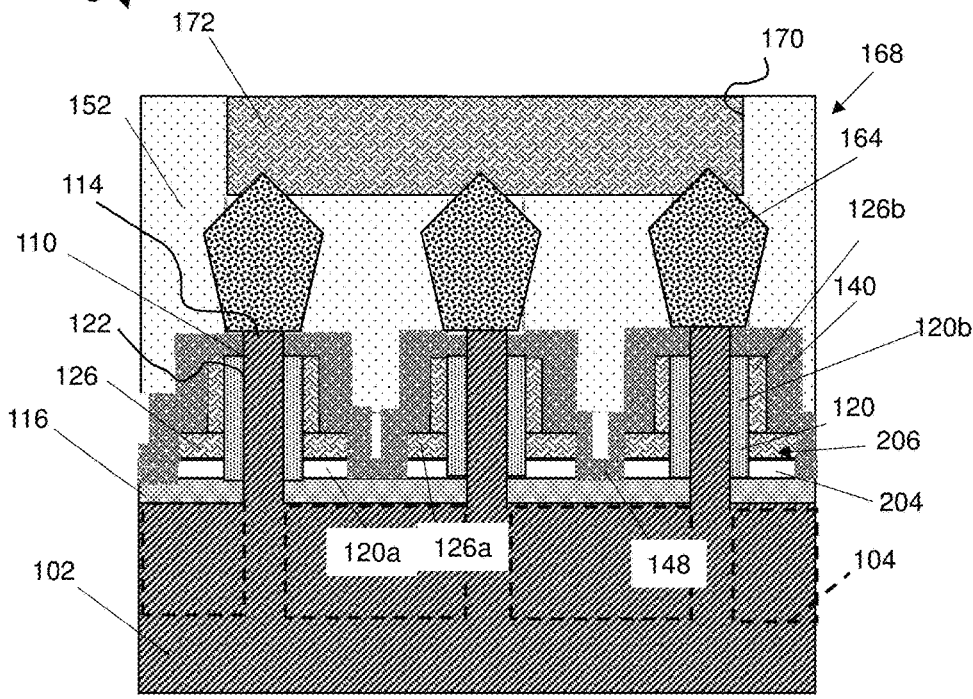
FIG. 20 shows a cross-sectional view of a resulting integrated circuit structure after undergoing aspects of another method according to embodiments of the disclosure.

FIGS. 18-20 show another embodiment of the disclosure. In this embodiment, an air gap may be formed within IC structure 100. More specifically, during the processes as described with respect to FIG. 3, a remaining part of portion 120a (FIG. 3) of gate dielectric layer 120 may also be removed from between substrate 102 and first portion 126a of metal stack 126 during the etching thereby creating an opening 202 (FIG. 18). In this embodiment, the etching may include a wet etch or plasma RIE. Further, as shown in FIG. 19, the forming of dielectric layer 140 (as was discussed relative to FIG. 6) may include conformally forming dielectric layer 140 such that opening 202 (FIG. 18) is closed thereby forming an air gap 204 between substrate 102 and first portion 126a of metal stack 126. In this way, portion 120b of dielectric layer 120 and airgap 204 define substantially L-shaped gate dielectric 206 having a dielectric constant greater than approximately 4.0. The method continues substantially the same as was described with respect to FIGS. 7-17.

FIG. 20 shows resulting IC structure 210 according to this embodiment after epitaxial regions 164 and conductor 170 are formed. IC structure 210 shown in FIG. 20 may include: set of fins 110 within ILD layer 152 on substrate 102 and gate dielectric layer 120 over substrate 102 and extending along opposing sidewalls 122 of each fin 110. Gate dielectric layer 120 may have a dielectric constant above approximately 4.0. IC structure 190 may also include metal stack 126 adjacent to gate dielectric layer 120 and on opposing sidewalls 122 of each fin 110. Metal stack 126 may include first portion 126a over substrate 102 and second portion 126b contacting gate dielectric layer 120 and extending along opposing sidewalls 122 of each fin 110. An air gap 204 may be disposed between first portion 126a of metal stack 126 and substrate 102 on opposing sidewalls 122 of fins 110. As shown in FIG. 20, gate dielectric layer 120 and air gap 204, together may define substantially L-shaped gate dielectric 206. Metal stack 126 on opposing sidewalls 122 of each fin 110 may also be substantially L-shaped. IC structure 210 may also include dielectric layer 140, 148 adjacent to metal stack 126 and on opposing sidewalls 122 of each fin 110. Dielectric layer 140, 148 may have a dielectric constant less than approximately 4.0. IC structure 210 may also include epitaxial regions 164 within ILD layer 152. Each epitaxial region 164 may be disposed over top surface 114 of a respective fin 110. Additionally, IC structure 210 may include conductor 172 within ILD layer 152 and extending over each epitaxial region 164.

In contrast to conventional VFETs, IC structure 210 may include substantially L-shaped gate dielectrics 206 (dielectric layer 120 and airgap 204, together) and metal stacks 126 on opposing sidewalls 122 of fins 110 that are separated from gate dielectrics 206 and metal stacks 126 on opposing sidewalls 122 of adjacent fins 110 by dielectric layer 140, 148 (having a low dielectric constant). As a result, IC structure 210 may include a reduced parasitic capacitance when compared to conventional VFETs.

Figure 21:
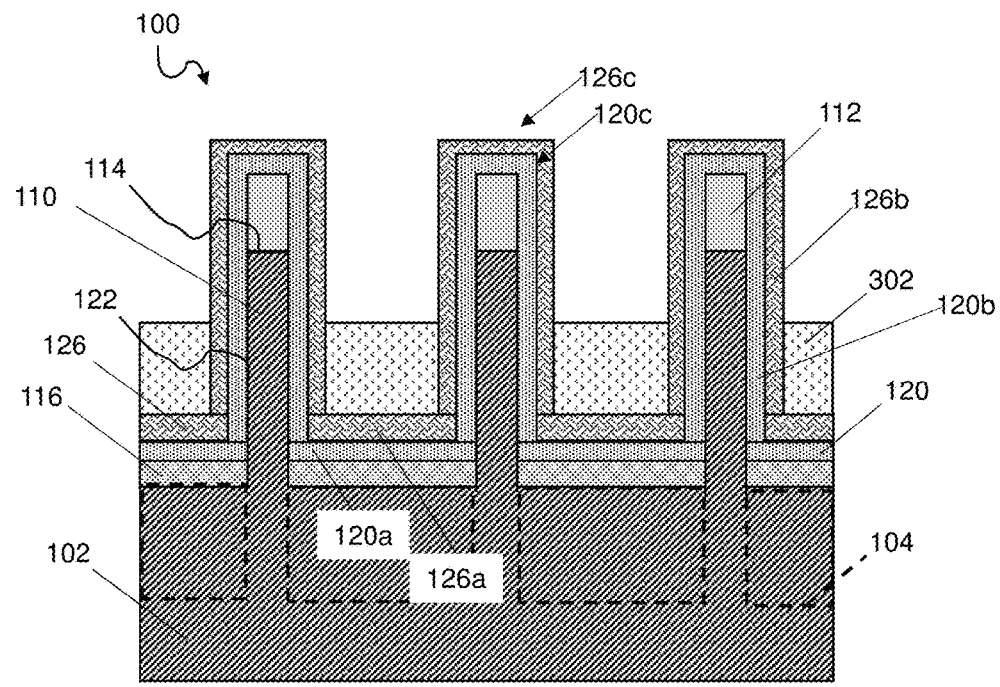
FIGS. 21-26 show a cross-sectional view of a preliminary integrated circuit structure undergoing aspects of another method according to embodiments of the disclosure.

FIGS. 21-27 show another embodiment of the disclosure. In this embodiment, a hard mask may be formed prior to forming sidewall spacers. That is, after the forming of metal stack 126 but prior to forming sidewalls spacers 130, a hard mask 302 may be formed, e.g., deposited, as shown in FIG. 21. As shown, hard mask 302 may be deposited and etching such that hard mask 302 is disposed in the field between adjacent fins 110 to a height that is less than fins 110. However, the height or thickness of hard mask 302 may be customized depending on the desired resulting IC structure. Hard mask 302 may include, for example, at least one of: amorphous silicon, amorphous carbon, or a spin on hard mask (SOH).

Figure 22:
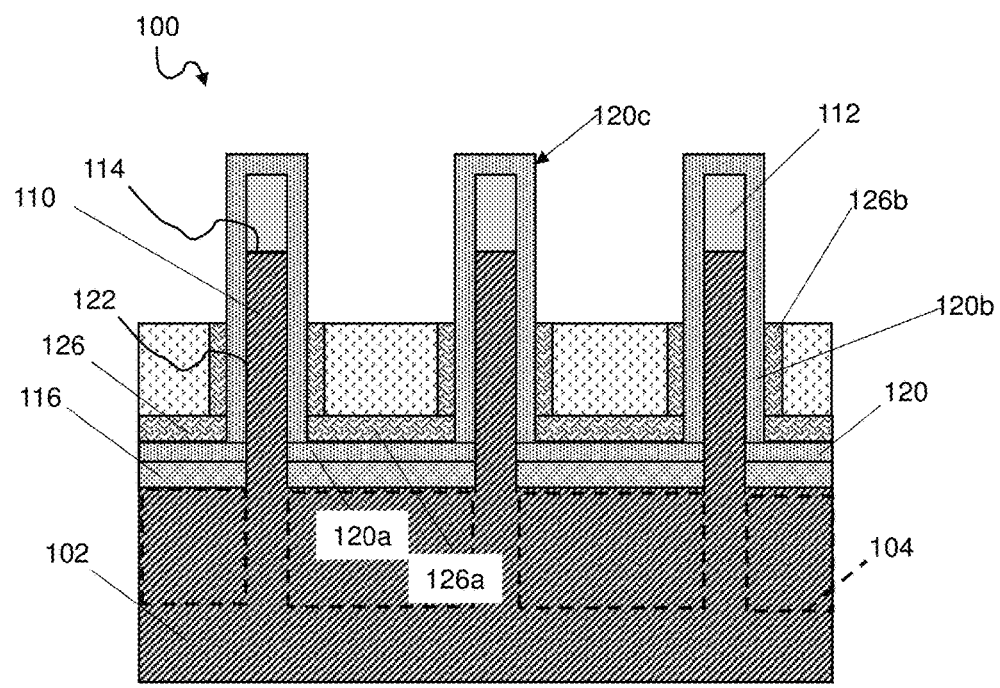

As shown in FIG. 22, an etching may be performed such that portions of metal stack 126 are removed. More specifically, portion 126c (FIG. 21) that is disposed over top surface 114 of fins 110 may be removed. In addition, a part of portion 120b that is disposed along sidewalls 122 of fins 110 above hard mask 302 may also be removed. As a result, metal stack 126 may be planar with hard mask 302 and portions of gate dielectric layer 120 may be exposed. More specifically, portion 120c of gate dielectric layer 120 over top surface 114 of fins 110 may be exposed. In addition, part of portion 120b that is disposed along sidewalls 122 of fins 110 above hard mask 302 may also be exposed.

Figure 23:
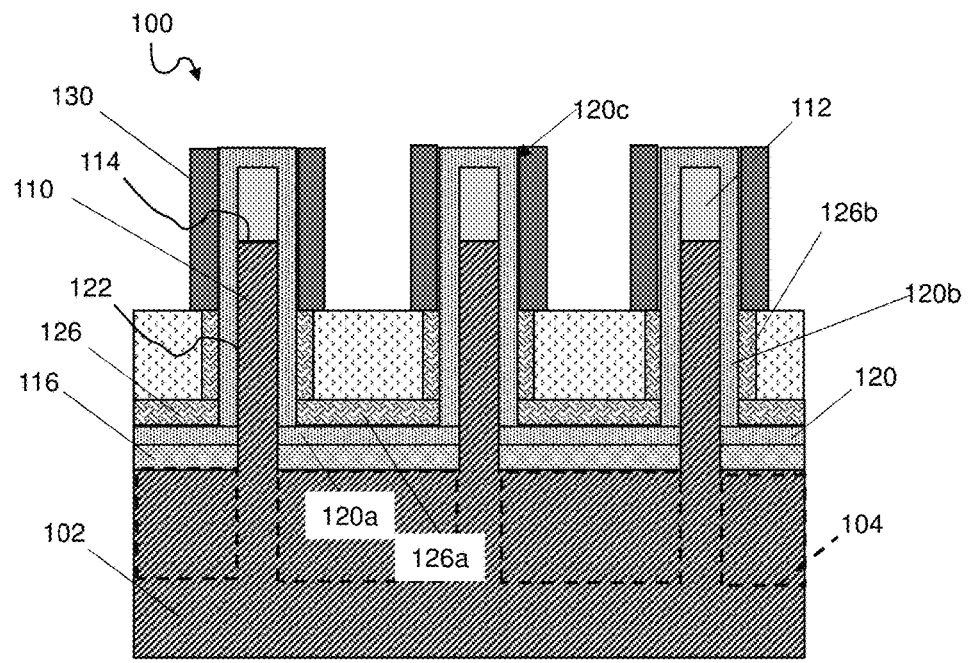
Figure 24:
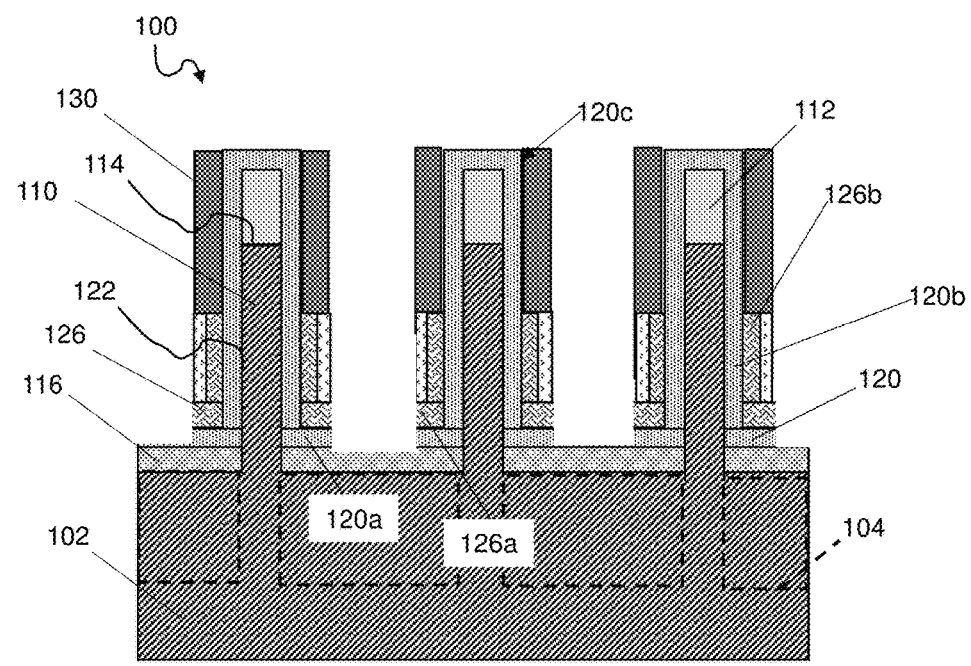

Turning now to FIG. 23, sidewall spacers 130 may be formed, e.g., deposited, patterned, and etched, along sidewalls 122 of fins 110. Sidewall spacers 130 may be formed over hard mask 302 and exposed parts of remaining portion 126b of metal stack 126. Sidewalls spacers 130 may contact and be disposed along exposed parts of portion 120b of gate dielectric layer 120. Sidewall spacers 130 may be approximately planar with portion 120c of gate dielectric layer 120 over top surface 114 of fins 110.

Sidewall spacers 130 may be used as a mask during an etching as was similarly discussed herein relative to FIG. 3. In this way, any material not protected by sidewalls spacers 130 (or photoresist 134 (FIG. 4)) may be removed. As a result, parts of portions 120a of gate dielectric layer 120 and portions 126a of metal stack 126 within the field between fins 110 may be removed, and bottom spacer 116 may be exposed within the field between fins 110.

Figure 25:
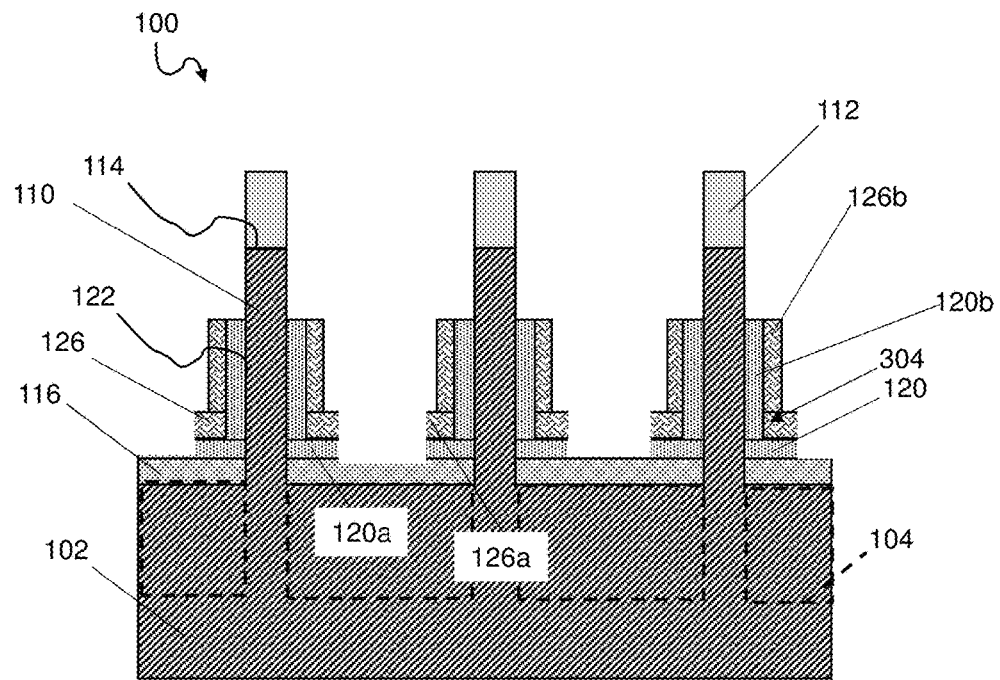
Figure 26:
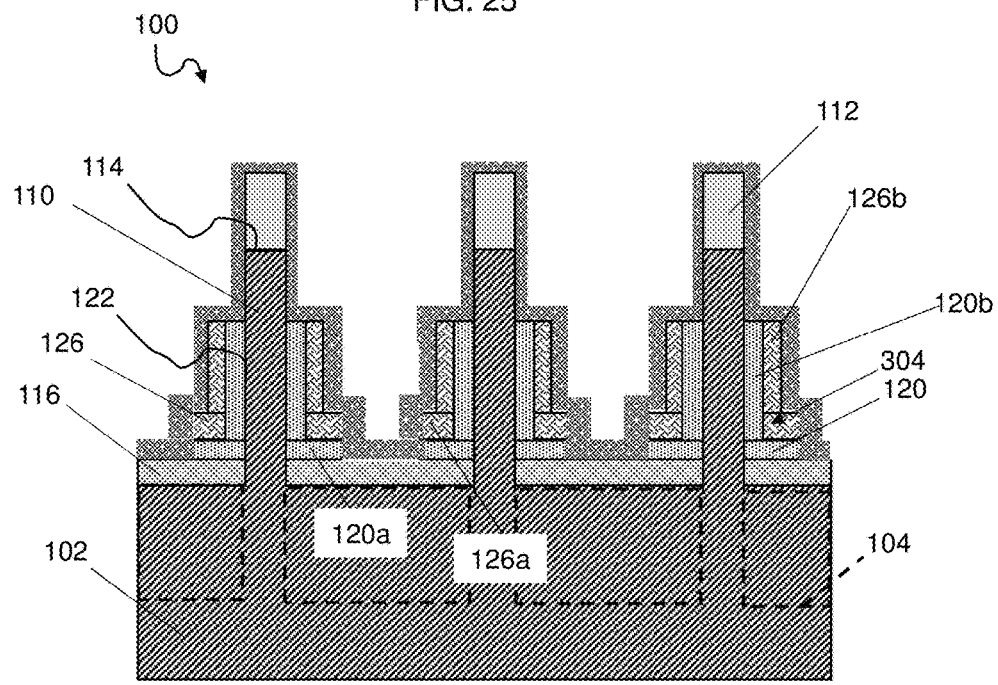
Figure 27:
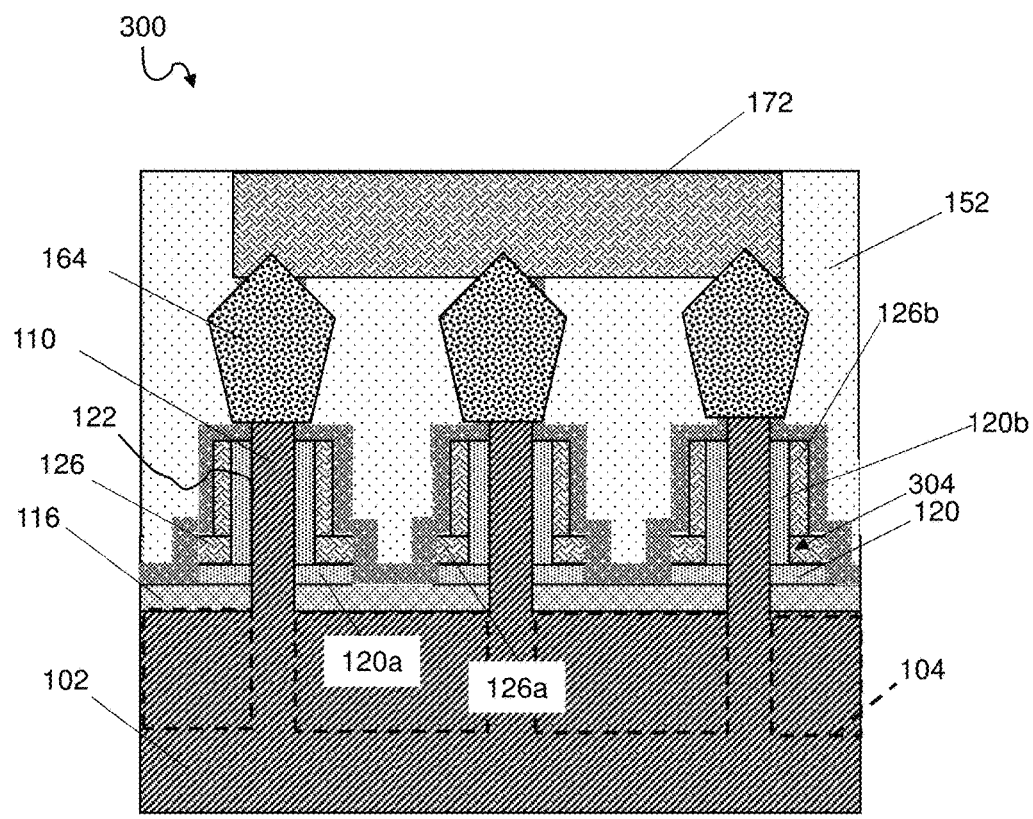
FIG. 27 shows a cross-sectional view of a resulting integrated circuit structure after undergoing aspects of another method according to embodiments of the disclosure.

Turning now to FIG. 25, another etching (or more than one etching) may be performed such that sidewalls spacers 130, parts of portion 126b metal stack 126, and any remaining portions of hard mask 302 may be removed. As a result, the remaining portion of gate dielectric layer 120 and metal stack 126 may be substantially L-shaped. That is, substantially L-shaped gate dielectric 304 may be defined. As shown in FIG. 26, dielectric layer 148 may be conformally deposited over IC structure 100 as was discussed relative to FIG. 9. Additionally, as shown in FIG. 27, the method may continue as discussed relative to FIGS. 10-15 to create a resulting IC structure 300. IC structure 300 is substantially similar to IC structure 190 of FIG. 15.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s). "Substantially" refers to largely, for the most part, entirely specified or any slight deviation which provides the same technical benefits of the disclosure.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit structure comprising:
a set of fins within an ILD layer on a substrate;
a first gate dielectric over the substrate and extending along opposing sidewalls of each fin in the set of fins, wherein the first gate dielectric has a dielectric constant above approximately 4.0;
a metal stack adjacent to the first gate dielectric and on the opposing sidewalls of each fin, the metal stack having a first portion over the substrate and a second portion contacting the first gate dielectric and extending along the opposing sidewalls of each fin;
an air gap disposed between the first portion of the metal stack and the substrate on the opposing sidewalls of each fin;
a conformal dielectric material adjacent to the metal stack and on the opposing sidewalls of each fin, the conformal dielectric material contacting the first portion of the metal stack, and the second portion of the metal stack, wherein a dielectric constant of the conformal dielectric material is smaller than that of the first gate dielectric;
a set of epitaxial regions within the ILD layer, each epitaxial region within the set of epitaxial regions being over the top surface of a respective fin in the set of fins; and
a conductor within the ILD layer and extending over each epitaxial region.

2. The integrated circuit structure of claim 1, wherein a portion of the first gate dielectric is disposed between the first portion of the metal stack and the substrate on the opposing sidewalls of each fin.

3. The integrated circuit structure of claim 2, wherein the conformal dielectric material separates the metal stack and the first gate dielectric along the opposing sidewalls of the set of fins from the metal stack and the first gate dielectric along the opposing sidewalls of an adjacent fin.

4. The integrated circuit structure of claim 1, further comprising:
another metal stack over the substrate and within the ILD layer, the another metal stack being disposed perpendicular to the set of fins and extending along at least one end of each fin in the set of fins.

5. The integrated circuit structure of claim 4, wherein the another metal stack extends along both ends of each fin in the set of fins.

6. The integrated circuit structure of claim 1, wherein the first gate dielectric and the metal stack on the opposing sidewalls of each fin are each substantially L-shaped.

7. A method for forming an integrated circuit structure, the method comprising:
   forming a set of fins from a substrate,
   forming a bottom spacer over the substrate between each fin in the set of fins;
   forming a first gate dielectric over the substrate and on opposing sidewalls of each fin in the set of fins extending from the substrate, the first gate dielectric including a first portion over the substrate and a second portion extending along the opposing sidewalls of each fin such that the first gate dielectric is substantially L-shaped, wherein the first gate dielectric has a dielectric constant above approximately 4.0;
   forming a metal stack over the first gate dielectric, the metal stack having a first portion over the first portion of the first gate dielectric and a second portion contacting the second portion of the first gate dielectric and extending along the opposing sidewalls of each fin such that the metal stack is substantially L-shaped;
   removing a part of the first portion of the metal stack and a part of the first portion of the first gate dielectric that covers the substrate from between adjacent fins of the set of fins;
   conformally forming a first dielectric layer over each fin such that the first dielectric layer substantially lines the second portion of the metal stack on the opposing sidewalls of each fin, the first dielectric layer separating the first portion of the metal stack on opposing sidewalls of each fin from the first portion of the metal stack on opposing sidewalls of an adjacent fin, wherein the first dielectric layer has a dielectric constant below approximately 4.0;
   forming an organic dielectric layer (ODL) over the substrate to a height that is less than a height of the first dielectric layer that is substantially lining the second portion of the metal stack on the opposing sidewalls of each fin;
   recessing the first dielectric layer, the second portion of the metal stack, and the second portion of the first gate dielectric on opposing sidewalls of each fin to the height of the ODL, such that a portion of the opposing sidewalls of each fin are exposed;
   conformally forming a second dielectric layer over each fin such that the second dielectric layer substantially lines the exposed portion of the opposing sidewalls of each fin, wherein the second dielectric layer has a dielectric constant below approximately 4.0;
   forming an interlevel dielectric (ILD) layer over the second dielectric layer, the first dielectric layer, and the set of fins;
   forming an epitaxial region over each fin within the ILD layer; and
   forming a conductor over each epitaxial region and within the ILD layer.

8. An integrated circuit structure comprising:
   a set of fins within an ILD layer on a substrate;
   a first gate dielectric over the substrate and extending along opposing sidewalls of each fin in the set of fins, wherein the first gate dielectric has a dielectric constant above approximately 4.0;
   a metal stack adjacent to the first gate dielectric and on the opposing sidewalls of each fin, the metal stack having a first portion over the substrate and a second portion contacting the first gate dielectric and extending along the opposing sidewalls of each fin;
   another metal stack over the substrate and within the ILD layer, the another metal stack being disposed perpendicular to the set of fins and extending along at least one end of each fin in the set of fins;
   a conformal dielectric material adjacent to the metal stack and on the opposing sidewalls of each fin, the conformal dielectric material contacting the first portion of the metal stack, and the second portion of the metal stack, wherein a dielectric constant of the conformal dielectric material is smaller than that of the first gate dielectric;
   a set of epitaxial regions within the ILD layer, each epitaxial region within the set of epitaxial regions being over the top surface of a respective fin in the set of fins; and
   a conductor within the ILD layer and extending over each epitaxial region.

* * * * *